US012198747B2

(12) United States Patent
Ku et al.

(10) Patent No.: US 12,198,747 B2
(45) Date of Patent: Jan. 14, 2025

(54) MEMORY INCLUDING ROW CIRCUIT AND OPERATION METHOD THEREOF

(71) Applicant: SK hynix Inc., Gyeonggi-do (KR)

(72) Inventors: Sang Hyun Ku, Gyeonggi-do (KR); Do Hong Kim, Gyeonggi-do (KR); Min Ho Seok, Gyeonggi-do (KR); Duck Hwa Hong, Gyeonggi-do (KR); So Yoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 142 days.

(21) Appl. No.: 18/104,795

(22) Filed: Feb. 2, 2023

(65) Prior Publication Data

US 2024/0161806 A1    May 16, 2024

(30) Foreign Application Priority Data

Nov. 11, 2022 (KR) ........................ 10-2022-0150671

(51) Int. Cl.
*G11C 11/406* (2006.01)
*G11C 11/408* (2006.01)

(52) U.S. Cl.
CPC .. *G11C 11/40615* (2013.01); *G11C 11/40622* (2013.01); *G11C 11/4085* (2013.01)

(58) Field of Classification Search
CPC ........ G11C 11/40615; G11C 11/40622; G11C 11/4085; G11C 11/4087; G11C 11/406
USPC .......................................................... 365/222
See application file for complete search history.

(56) References Cited

U.S. PATENT DOCUMENTS 9,620,198 B1 * 4/2017 Nam .................... G11C 11/4085
2007/0268763 A1  11/2007 Im et al.
2021/0151092 A1   5/2021 Lee
2021/0383858 A1 * 12/2021 Kim .................. G11C 11/40615

* cited by examiner

*Primary Examiner* — Fernando Hidalgo
(74) *Attorney, Agent, or Firm* — IP & T GROUP LLP

(57) ABSTRACT

A memory includes: a plurality of word lines; and a row circuit configured to: activate at least one word line among the word lines to an active voltage level during an active operation and discharge the activated word line during a precharge operation; and discharge the word line from the active voltage level to a precharge voltage level in different manners during the precharge operation in response to a precharge command and during the precharge operation during a refresh operation.

17 Claims, 8 Drawing Sheets

MEMORY INCLUDING ROW CIRCUIT AND OPERATION METHOD THEREOF

CROSS-REFERENCE TO RELATED APPLICATIONS

The present application claims priority of Korean Patent Application No. 10-2022-0150671, filed on Nov. 11, 2022, which is incorporated herein by reference in its entirety.

BACKGROUND

1. Field

Various embodiments of the present invention relate to a memory.

2. Description of the Related Art

As the degree of integration of memories increases, the spacing between a plurality of word lines included in the memories decreases. As the spacing between word lines decreases, the coupling effect between the neighboring word lines increases.

Whenever data is input or output to or from a memory cell, a word line toggles between an activated state and a deactivated state. As the coupling effect between the neighboring word lines increases, the data in the memory cell coupled to a word line which is disposed adjacent to a frequently activated word line may be damaged. This phenomenon is referred to as 'row hammering (or word line disturbance). The data of a memory cell may be damaged before the memory cell is refreshed due to the word line disturbance.

FIG. 1 is schematic diagram for describing row hammering. FIG. 1 shows a portion of a cell array included in a memory device.

In FIG. 1, 'WLL' may correspond to a word line with a large number of activations (i.e., a frequently activated word line), and 'WLL−1' and 'WLL+1' may be word lines disposed adjacent to 'WLL' (i.e., neighboring word lines), that is, word lines disposed adjacent to the word line with a large number of activations. Also, 'CL' may represent a memory cell that is coupled to the 'WLL', and 'CL−1' may represent a memory cell that is coupled to the 'WLL−1', and 'CL+1' may represent a memory cell that is coupled to the 'WLL+1'. The memory cells may include cell transistors TL, TL−1, and TL+1 and cell capacitors CAPL, CAPL−1, and CAPL+1, respectively.

When 'WLL' is activated or deactivated in FIG. 1, the voltages of 'WLL−1' and 'WLL+1' may rise or fall due to the coupling effect that occurs between the 'WLL' and the 'WLL−1' and 'WLL+1', also affecting the amount of charges in the cell capacitors CL−1 and CL+1. Therefore, when the 'WLL' is frequently activated and the 'WLL' toggles between an activated state and a deactivated state, the change in the amount of charges stored in the cell capacitors CAPL−1 and CAPL+1 that are respectively included in the 'CL−1' and the 'CL+1' may increase, and thus the data in the memory cell may be deteriorated.

Also, the electromagnetic wave generated when the word line toggles between the activated state and the deactivated state may damage the data by introducing electrons into the cell capacitor of the memory cell coupled to a neighboring word line or by discharging electrons out of the cell capacitor.

As a method for solving row hammering, techniques for reducing the influence of activation and deactivation of a word line on the rows positioned adjacent to an activated row may include a method of detecting a row (word line) which is activated several times and refreshing the rows neighboring the row which is activated several times is mainly used.

SUMMARY

Embodiments of the present invention are directed to a memory capable of reducing the burden of a precharge operation that is performed during a refresh operation.

In accordance with an embodiment of the present invention, a memory includes: a plurality of word lines; and a row circuit configured to: activate at least one word line among the word lines to an active voltage level during an active operation and discharge the activated word line during a precharge operation; and discharge the word line from the active voltage level to a precharge voltage level in different manners during the precharge operation in response to a precharge command and during the precharge operation during a refresh operation.

In accordance with another embodiment of the present invention, a memory includes: a plurality of word lines; and a row circuit configured to: activate a selected word line among word lines in response to activation of a row active signal, and precharge the selected word line in response to deactivation of the row active signal, wherein the row circuit precharges the selected word line differently according to a level of a refresh flag signal representing whether a refresh operation is being performed.

In accordance with another embodiment of the present invention, an operating method of a memory includes: discharging, in response to a precharge command, a word line from an active level to a precharge level in a soft manner; and discharging, during a refresh operation, the word line from the active level to the precharge level in a relatively less soft manner.

In accordance with another embodiment of the present invention, a method for operating a memory includes: receiving an active command; driving a word line to an active voltage level in response to the active command; receiving a precharge command; discharging the word line to a precharge voltage level in response to the precharge command such that a waveform of the discharge from the active voltage level to the precharge voltage level has a first pattern; determining to perform a refresh operation; driving the word line to the active voltage level during the refresh operation; and discharging the word line to the precharge voltage level during the refresh operation such that the waveform has a second pattern.

In the method, the discharging of the word line in response to the precharge command includes: discharging the word line to an intermediate voltage level between the active voltage level and the precharge voltage level and maintaining the intermediate voltage level for a predetermined time; and discharging the word line from the intermediate voltage level to the precharge voltage level, and the discharging of the word line during the refresh operation includes discharging the word line from the active voltage level directly to the precharge voltage level. In the method, the discharging of the word line in response to the precharge command includes: discharging the word line to an intermediate voltage level between the active voltage level and the precharge voltage level and maintaining the intermediate voltage level for a first time; and discharging the word line from the intermediate voltage level to the precharge voltage level, and the discharging of the word line during the refresh operation includes: discharging the word line to the intermediate voltage level and maintaining the intermediate voltage level for a second time which is shorter than the first time; and discharging the word line from the intermediate voltage level to the precharge voltage level. In the method, the discharging of the word line in response to the precharge command includes: discharging the word line to a first intermediate voltage level between the active voltage level and the precharge voltage level and maintaining the first intermediate voltage level for a predetermined time; and discharging the word line from the first intermediate voltage level to the precharge voltage level, and the discharging of the word line during the refresh operation includes: discharging the word line to a second intermediate voltage level between the first intermediate voltage level and the precharge voltage level and maintaining the second intermediate voltage level for a predetermined time; and discharging the word line from the second intermediate voltage level to the precharge voltage level. In the method, the discharging of the word line in response to the precharge command includes discharging the word line from the active voltage level to the precharge voltage level for a first discharge time, and the discharging of the word line during the refresh operation includes discharging the word line from the active voltage level directly to the precharge voltage level for a second discharge time shorter than the first discharge time.

In the method, the determining to perform the refresh operation includes receiving a refresh command. In the method, the determining to perform the refresh operation includes activating a self-refresh signal in a self-refresh operation mode. In the method, the determining to perform the refresh operation includes receiving a command directing a smart refresh operation.

DETAILED DESCRIPTION

Figure 1:
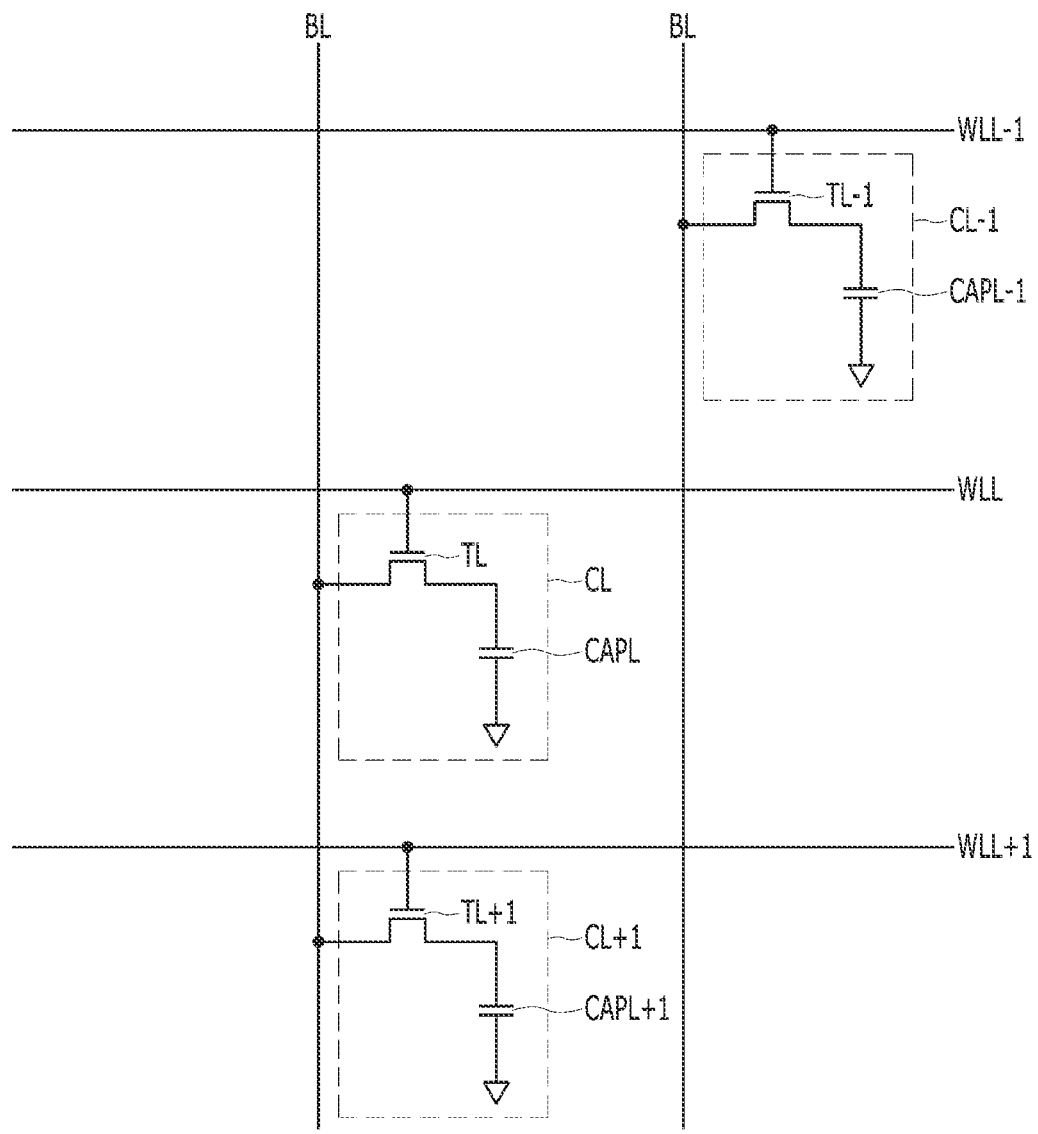
FIG. 1 is schematic diagram for describing row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 2:
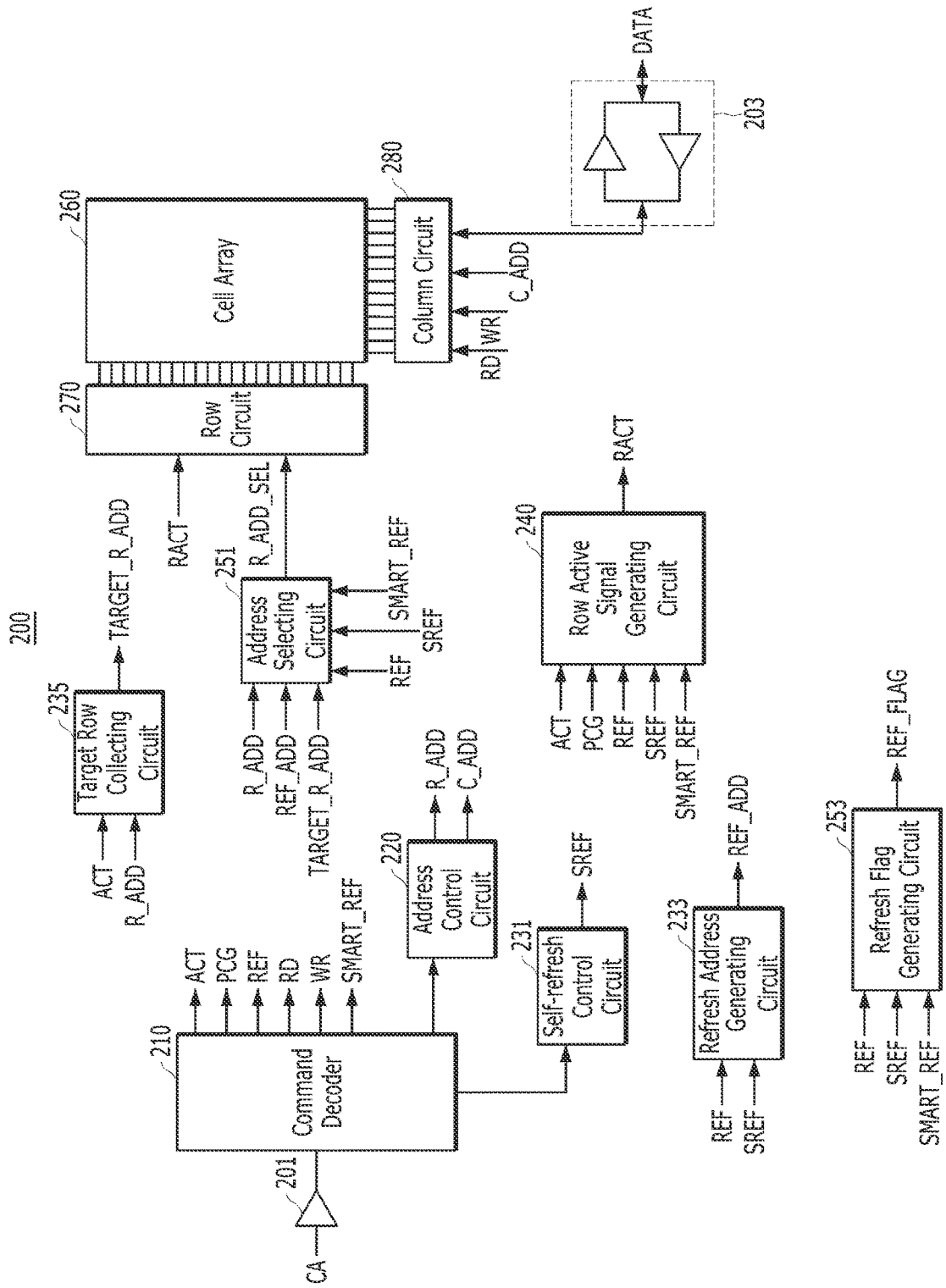
FIG. 2 is a block diagram illustrating a memory in accordance with an embodiment of the present invention.

FIG. 2 is a block diagram illustrating a memory 200 in accordance with an embodiment of the present invention.

Referring to FIG. 2, the memory 200 may include a command address receiving circuit 201, a data transferring/receiving circuit 203, a command decoder 210, an address control circuit 220, a self-refresh control circuit 231, a refresh address generating circuit 233, a target row collecting circuit 235, a row active signal generating circuit 240, an address selecting circuit 251, a refresh flag generating circuit 253, a cell array 260, a row circuit 270, and a column circuit 280.

The command address receiving circuit 201 may receive a command/address signal CA. Depending on the type of memory 200, a command and an address may be input to the same input terminal, or a command and an address may be input to separate input terminals. In this case, it is described that the command and the address are input to the same input terminal. The command/address signal CA may be of multiple bits.

The data transferring/receiving circuit 203 may receive data DATA or transfer data DATA. The data transferring/receiving circuit 203 may receive data DATA to be written into the cell array 260 during a write operation, and transfer the data DATA that are read from the cell array 260 during a read operation.

The command decoder 210 may decode the command/address signal CA to determine the type of an operation directed by a memory controller to the memory 200. An active signal ACT may be a signal that is activated when an active operation is directed, and a precharge signal PCG may be a signal that is activated when a precharge operation is directed. A refresh signal REF may be a signal that is activated when an (auto) refresh operation is directed. Also, a write signal WR may be a signal that is activated when a write operation is directed, and a read signal RD may be a signal that is activated when a read operation is directed. A smart refresh signal SMART_REF may be a signal that is activated when a smart refresh operation is directed. A command directing a smart refresh operation may also be referred to as a refresh management (RFM) command.

The address control circuit 220 may classify the address received from the command decoder 210 as a row address R_ADD or a column address C_ADD. The address control circuit 220 may classify an address as a row address R_ADD when an active operation is directed as a result of the decoding by the command decoder 210, and may classify the address as a column address C_ADD when a read or write operation is directed.

The self-refresh control circuit 231 may activate a self-refresh signal SREF periodically in a self-refresh mode. The self-refresh mode may be set by the command decoder 210 that receives a direction from the memory controller.

The refresh address generating circuit 233 may generate a refresh address REF_ADD to be used for a refresh operation. Since only a row address is used during a refresh operation, the refresh address REF_ADD may be a row address. The refresh address REF_ADD may be used for an auto-refresh operation and a self-refresh operation. Whenever the auto-refresh operation or the self-refresh operation is performed, that is, whenever the refresh signal REF or the self-refresh signal SREF is activated, the refresh address REF_ADD may be changed so that the rows of the cell array 260 may be sequentially refreshed.

The target row collecting circuit 235 may collect information about a row in which data are highly likely to be lost due to row hammering among the rows of the cell array 260, which is referred to as a target row, and may provide a target row address TARGET_R_ADD. The target row collecting circuit 235 may select a row which is adjacent to a row that has been activated excessively many times as a target row. A target row may be selected using a combination of various methods, such as a method of counting the number of times that the rows of the cell array 260 are activated and a method of randomly sampling the rows that are activated in the cell array 260. The target row collecting circuit 235 may monitor the activation of the rows of the cell array 260 based on the active signal ACT and the row address R_ADD.

The row active signal generating circuit 240 may generate a row active signal RACT for controlling active and precharge operations. When the row active signal RACT is activated, a row selected based on the address R_ADD_SEL which is selected by the address selecting circuit 251 among the rows of the cell array 260 may be activated, and when the row active signal RACT is deactivated, the activated row may be precharged.

The row active signal generating circuit 240 may activate the row active signal RACT when the active signal ACT is activated, and deactivates the row active signal RACT when the precharge signal PCG is activated. That is, the selected row of the cell array 260 may be activated in response to an active command and precharged in response to a precharge command.

Also, the row active signal generating circuit 240 may activate and deactivate the active row signal RACT in response to the refresh signals REF, SREF, and SMART_REF. When one among the refresh signals REF, SREF, and SMART_REF is activated, the row active signal generating circuit 240 may activate the row active signal RACT and deactivate it after a predetermined time. For example, the row active signal generating circuit 240 may activate the row active signal RACT in response to the activation of the self-refresh signal SREF and deactivate the row active signal RACT after a predetermined time passes.

The address selecting circuit 251 may select one among the row address R_ADD, the refresh address REF_ADD, and the target row address TARGET_R_ADD and transfer the selected address to the row circuit 270. The address selecting circuit 251 may select and output the row address R_ADD during an active operation based on the active signal ACT, that is, when all of the refresh signals REF, SREF, and SMART_REF are deactivated. The address selecting circuit 251 may select and output the refresh address REF_ADD during an auto-refresh operation and/or a self-refresh operation, that is, when one among the refresh signal REF and the self-refresh signal SREF is activated. Also, the address selecting circuit 251 may select and output the target row address TARGET_R_ADD during a smart refresh operation, that is, when the smart refresh signal SMART_REF is activated.

The refresh flag generating circuit 253 may generate a refresh flag REF_FLAG representing that a refresh operation is being performed. The refresh flag generating circuit 253 may activate the refresh flag signal REF_FLAG when one among the refresh signals REF, SREF, and SMART_REF is activated, and maintains the refresh flag signal REF_FLAG in an activated state during a refresh operation period.

The cell array 260 may include a plurality of word lines (e.g., row lines) and a plurality of bit lines (e.g., column lines) and a plurality of memory cells provided at intersections between the word lines and the bit lines. Each of the memory cells may include a transistor which is controlled by a corresponding word line, and a capacitor for storing data that are input/output through a corresponding bit line.

The row circuit 270 may control a row operation of the cell array 260. When the row active signal RACT is activated, the row circuit may activate a word line corresponding to the address R_ADD_SEL which is selected by the address selecting circuit 251 among a plurality of word lines, and when the row active signal RACT is deactivated, the row circuit 270 may precharge (deactivate) the activated word line.

As described above, when a word line is activated and then precharged (deactivated), that is, when a word line toggles, the data of the memory cells that are coupled to the word lines positioned adjacent to the toggling word line may be deteriorated due to the coupling effect. This phenomenon is called row hammering. As one method for reducing the effect of row hammering, a soft-landing method may be used. Soft landing means reducing the row hammering effect by slowing the precharge when a word line is precharged, or by keeping the word line at an intermediate voltage level for a predetermined time before being discharged from the active voltage level to an inactive voltage level.

A word line may be precharged even when a word line is activated based on an active command and then precharged based on the precharge command, but a word line may also be precharged during a refresh operation. In the former case, since row hammering may become a problem, a soft-landing operation may be essential during the precharging. However, in the latter case, since it is just an operation to reduce the row hammering, the soft-landing operation may not be essential. For example, during a refresh operation, after a third word line is active precharged, a fourth word line may be active precharged, and a fifth word line may be active precharged. However, since the memory cells of the third word line and the fifth word line are refreshed at a moment when the fourth word line toggles, there is no need to worry about row hammering. Considering this point, the row circuit 270 may be able to control the soft-landing differently in the word line precharge operation that is performed based on the precharge command and the word line precharge operation that is performed during a refresh operation. That is, the row circuit 270 may be able to make the voltage waveforms of the process of discharging the activated word line to the precharge voltage level to be different when the refresh flag REF_FLAG is deactivated and when the refresh flag REF_FLAG is activated.

The column circuit 280 may control a column operation of the cell array 260. When the read signal RD is activated, the column circuit 280 may read data from the bit lines corresponding to the column address C_ADD and transfer the read data to the data transferring/receiving circuit 203. When the read signal RD is activated, data may be read from the memory cells coupled to the bit lines that are selected based on the column address C_ADD among the memory cells coupled to the word line selected based on the row address R_ADD, and transferred to the data transferring/receiving circuit 203. When the write signal WR is activated, the column circuit 280 may transfer the data transferred from the data transferring/receiving circuit 203 to the bit lines corresponding to the column address C_ADD so that the data may be written. Namely, when the write signal WR is activated, the data received by the data transferring/ receiving circuit 203 may be written into the memory cells coupled to the bit lines selected based on the column address C_ADD among the memory cells coupled to the word line which is selected based on the row address R_ADD.

Figure 3:
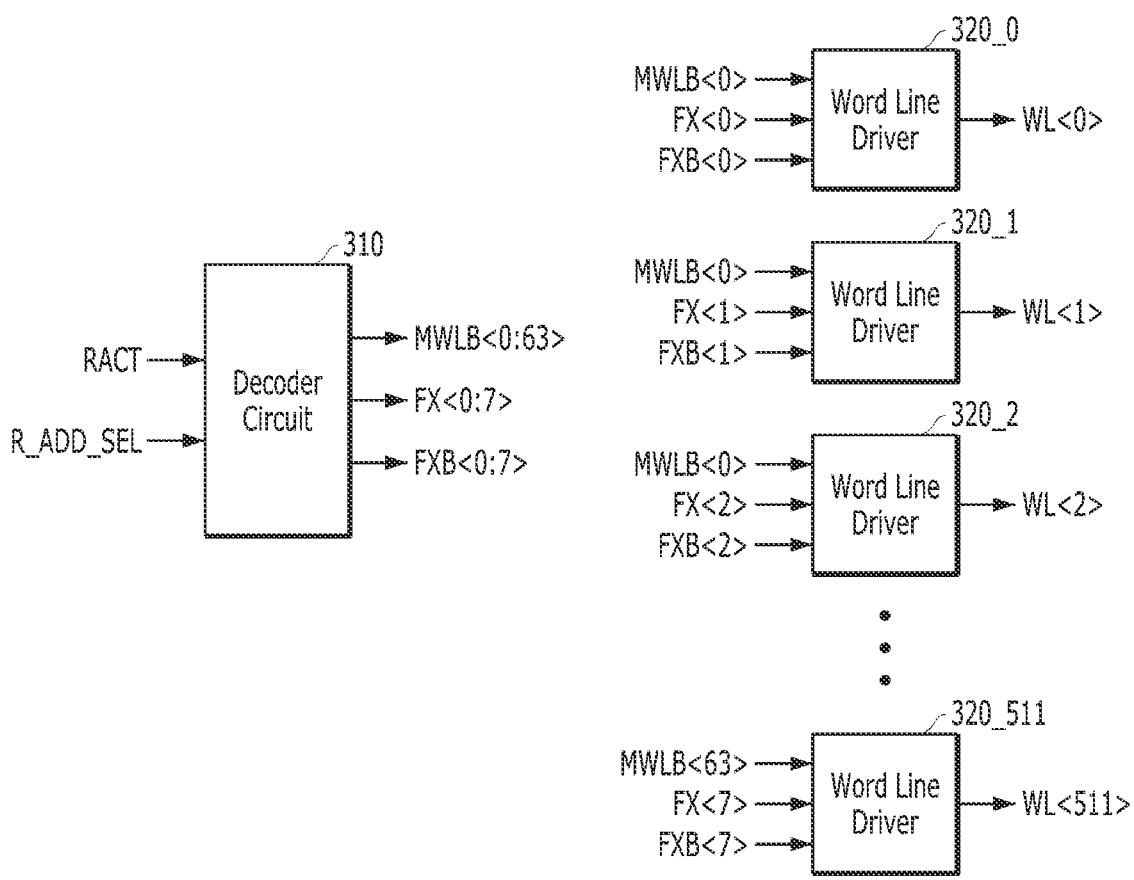
FIG. 3 is a detailed block diagram illustrating a row circuit shown in FIG. 2 in accordance with an embodiment of the present invention.

FIG. 3 is a detailed block diagram illustrating the row circuit 270 shown in FIG. 2 in accordance with an embodiment of the present invention.

Referring to FIG. 3, the row circuit 270 may include a decoder circuit 310 and word line drivers 320_0 to 320_511.

The decoder circuit 310 may use the row active signal RACT and the address R_ADD_SEL which is selected by the address selecting circuit 251 to generate control signals MWLB<0:63>, FX<0:7>, and FXB<0:7> for enabling a word line corresponding to the selected address R_ADD_SEL among the word lines WL<0:511> to be activated and pre-charged based on the row active signal RACT. It is illustrated that there are 64 main word line signals MWLB<0:63> and 8 first FIAX signals FX<0:7> and 8 second FIAX signals FXB<0:7> among the control signals MWLB<0:63>, FX<0:7>, and FXB<0:7>. With the combinations of 64*8, it may be possible to control the activation and deactivation of the 512 word lines WL<0:511>.

The following Table 1 shows the control signals MWLB<0:63>, FX<0:7>, and FXB<0:7> involving in the activation and deactivation of the word lines WL<0:511>.

TABLE 1

| WL<0> | MWLB<0> | FX<0>, FXB<0> |
|---|---|---|
| WL<1> | MWLB<0> | FX<1>, FXB<1> |
| WL<2> | MWLB<0> | FX<2>, FXB<2> |
| WL<3> | MWLB<0> | FX<3>, FXB<3> |
| WL<4> | MWLB<0> | FX<4>, FXB<4> |
| WL<5> | MWLB<0> | FX<5>, FXB<5> |
| WL<6> | MWLB<0> | FX<6>, FXB<6> |
| WL<7> | MWLB<0> | FX<7>, FXB<7> |
| WL<8> | MWLB<1> | FX<0>, FXB<0> |
| WL<9> | MWLB<1> | FX<1>, FXB<1> |
| WL<10> | MWLB<1> | FX<2>, FXB<2> |
| WL<11> | MWLB<1> | FX<3>, FXB<3> |
| WL<12> | MWLB<1> | FX<4>, FXB<4> |
| WL<13> | MWLB<1> | FX<5>, FXB<5> |
| WL<14> | MWLB<1> | FX<6>, FXB<6> |
| WL<15> | MWLB<1> | FX<7>, FXB<7> |
| WL<16> | MWLB<2> | FX<0>, FXB<0> |
| WL<17> | MWLB<2> | FX<1>, FXB<1> |
| ... | ... | ... |
| WL<510> | MWLB<63> | FX<6>, FXB<6> |
| WL<511> | MWLB<63> | FX<7>, FXB<7> |

Referring to Table 1, it may be seen that the activation and deactivation of the word line WL<3> may be controlled based on the main word line signal MWLB<0>, the first FIAX signal FX<3>, and the second FIAX signal FXB<3>, and the activation and deactivation of the word line WL<17> may be controlled based on the main word line signal MWLB<2>, the first FIAX signal FX<1> and the second FIAX signal FXB<1>. Herein, it is illustrated that the number of the word lines WL<0:511> is 512, and the number of the main word line signals MWLB<0:63> is 64, and the number of the first FIAX signals FX<0:7> and the number of the second FIAX signals FXB<0:7> are 8. However, it is obvious to those skilled in the art that the number of the word lines and those signals may be different from this example.

The word line drivers 320_0 to 320_511 may drive the word lines WL<0:511> in response to the control signals MWLB<0:63>, FX<0:7>, and FXB<0:7>. Table 1 shows the control signals MWLB<0:63>, FX<0:7>, and FXB<0:7> that are used by the word line drivers 320_0 to 320_511.

For example, the word line driver 320_3 may drive the word line WL<3> in response to the main word line signal MWLB<0>, the first FIAX signal FX<3>, and the second FIAX signal FXB<3>.

Figure 4:
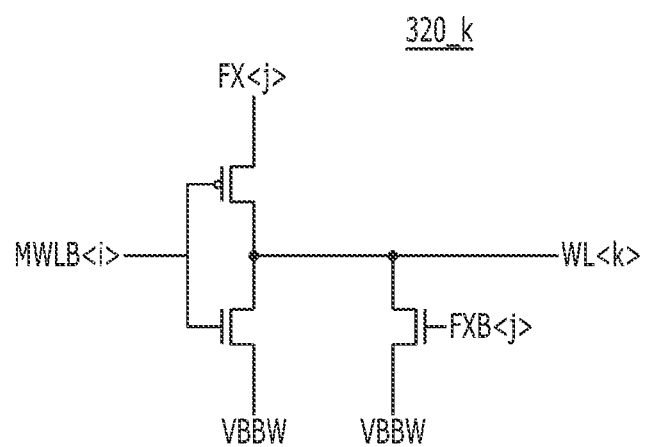
FIG. 4 is a block detailed diagram illustrating a word line driver shown in FIG. 3 in accordance with an embodiment of the present invention.

FIG. 4 is a detailed block diagram illustrating a word line driver 320_k shown in FIG. 3 in accordance with an embodiment of the present invention.

Referring to FIG. 4, the word line driver 320_k may include a PMOS transistor 401 and NMOS transistors 403 and 405. In FIG. 4, i may be an arbitrary integer of 0 to 63, and j may be an arbitrary integer of 0 to 7, and k may be an arbitrary integer of 0 to 511.

The PMOS transistor 401 may drive a word line WL<k> to the voltage level of the first FIAX signal FX<j> in response to the main word line signal MWLB<i>. The NMOS transistor 403 may drive the word line WL<k> to the precharge voltage level VBBW in response to the main word line signal MWLB<i>. Also, the NMOS transistor 405 may drive the word line WL<k> to the precharge voltage level VBBW in response to the second FIAX signal FXB<j>.

Referring to FIGS. 5 to 8, various embodiments in which the word line driver 320_k activates and precharges the word line WL<k> will be described. Hereinafter, the word line WL<k> is selected based on the selected address R_ADD_SEL. In this case, the main word line signal MWLB that does not correspond to the word line WL<k> may maintain a high level, and the first FIAX signal FX that does not correspond to the word line WL<k> may maintain a low level, and the second FIAX signal FXB that does not correspond to the word line WL<k> may maintain a high level. For example, when the word line WL<k> is the word line WL<10>, the main word line signals MWLB<0> and MWLB<2:63> may maintain a high level, and the first FIAX signals FX<0:1> and FX<3:7> may maintain a low level, and the second FIAX signals FXB<0:1> and FXB<3:7> may maintain a high level. Accordingly, the word lines WL<0:9> and WL<11:511> other than the word line WL<10> may maintain the precharged state.

Figure 5:
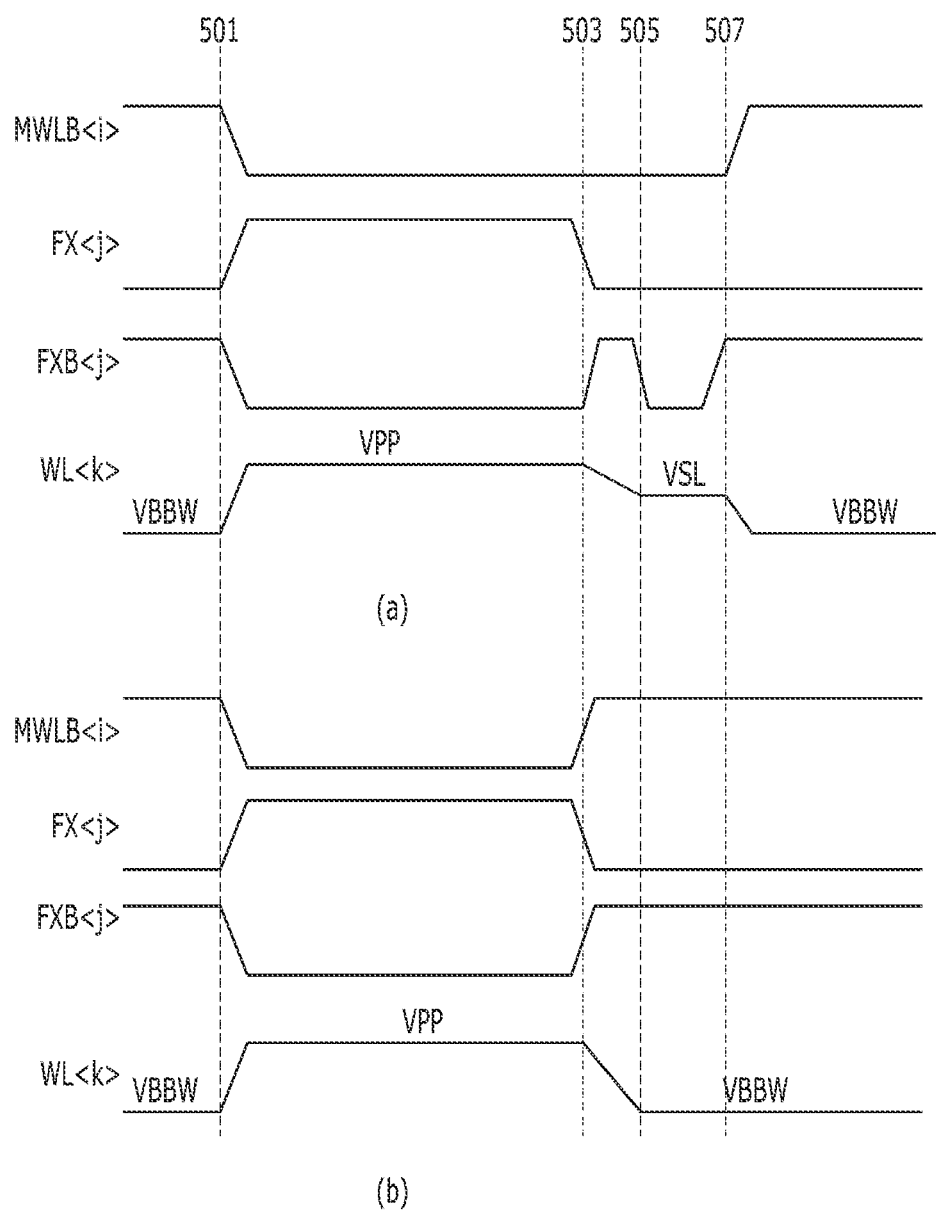
FIG. 5 is a timing diagram for describing an operation of the word line driver in accordance with a first embodiment of the present invention.

FIG. 5 is a timing diagram for describing an operation of the word line driver 320_k in accordance with a first embodiment of the present invention.

In FIG. 5, (a) is a timing diagram for describing an operation of the word line driver 320_k when the word line driver 320_k activates and precharges the word line WL<k> in response to an active command and a precharge command. That is, (a) of FIG. 5 shows the operation of the word line driver 320_k when the refresh flag REF_FLAG is deactivated.

Referring to (a) of FIG. 5, an active operation may begin at a moment 501. At the moment 501, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to an active voltage level VPP.

A precharge operation may begin at a moment 503. At the moment 503, the first FIAX signal FX<j> may transition from a high level to a low level. Also, the second FIAX signal FXB<j> may transition from a low level to a high level at the moment 503 and may be maintained until a moment 505. The NMOS transistor 405 of the word line driver 320_k may be turned on from the moment 503 to the moment 505 to pull-down drive the word line WL<k>, and the word line WL<k> may be discharged to an intermediate voltage level VSL. Herein, the intermediate voltage level VSL may be a voltage level which is lower than the active voltage level VPP and higher than the precharge voltage level VBBW. At the moment 505, since the second FIAX signal FXB<j> transitions from a high level to a low level, the NMOS transistor 405 may be turned off, and the voltage level of the word line WL<k> may be maintained at the intermediate voltage level VSL until a moment 507. At a moment 507, since the main word line signal MWLB<i> transitions to a high level and the second FIAX signal FXB<j> transitions to a high level, the NMOS transistors 403 and 405 may be turned on and the word line WL<k> may be discharged to the precharge voltage level VBBW.

In FIG. 5, (b) is a timing diagram for describing an operation of the word line driver 320_k when the word line driver 320_k activates and precharges the word line WL<k> during a refresh operation. That is, (b) of FIG. 5 shows the operation of the word line driver 320_k when the refresh flag REF_FLAG is activated.

Referring to (b) of FIG. 5, an active operation may begin at a moment 501. At the moment 501, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 503. At the moment 503, the main word line signal MWLB<i> may transition to a high level, and the first FIAX signal FX<j> may transition to a low level, and the second FIAX signal FXB<j> may transition to a high level. Accordingly, the PMOS transistor 401 may be turned off, and the NMOS transistors 403 and 405 may be turned on so that the word line WL<k> may be precharged to the precharge voltage level VBBW.

Referring to (a) of FIG. 5, it may be seen that during a precharge operation which is performed in response to a precharge command, the word line WL<k> may be discharged from the active voltage level VPP to the intermediate voltage level VSL, maintained at the intermediate voltage level VSL for a predetermined time, and then discharged to the precharge voltage level VBBW. In this case, it may be seen that a soft-landing operation may be performed. However, it may be seen that during the precharge operation which is performed during the refresh operation of (b) of FIG. 5, the word line WL<k> is directly discharged from the active voltage level VPP to the precharge voltage level VBBW. In this case, it may be seen that a soft-landing operation may not be performed.

Referring to (a) and (b) of FIG. 5, it may be seen that the waveform of the process of precharging the word line WL<k> based on the precharge command and the waveform of the process of precharging the word line WL<k> during a refresh operation may be different from each other.

Figure 6:
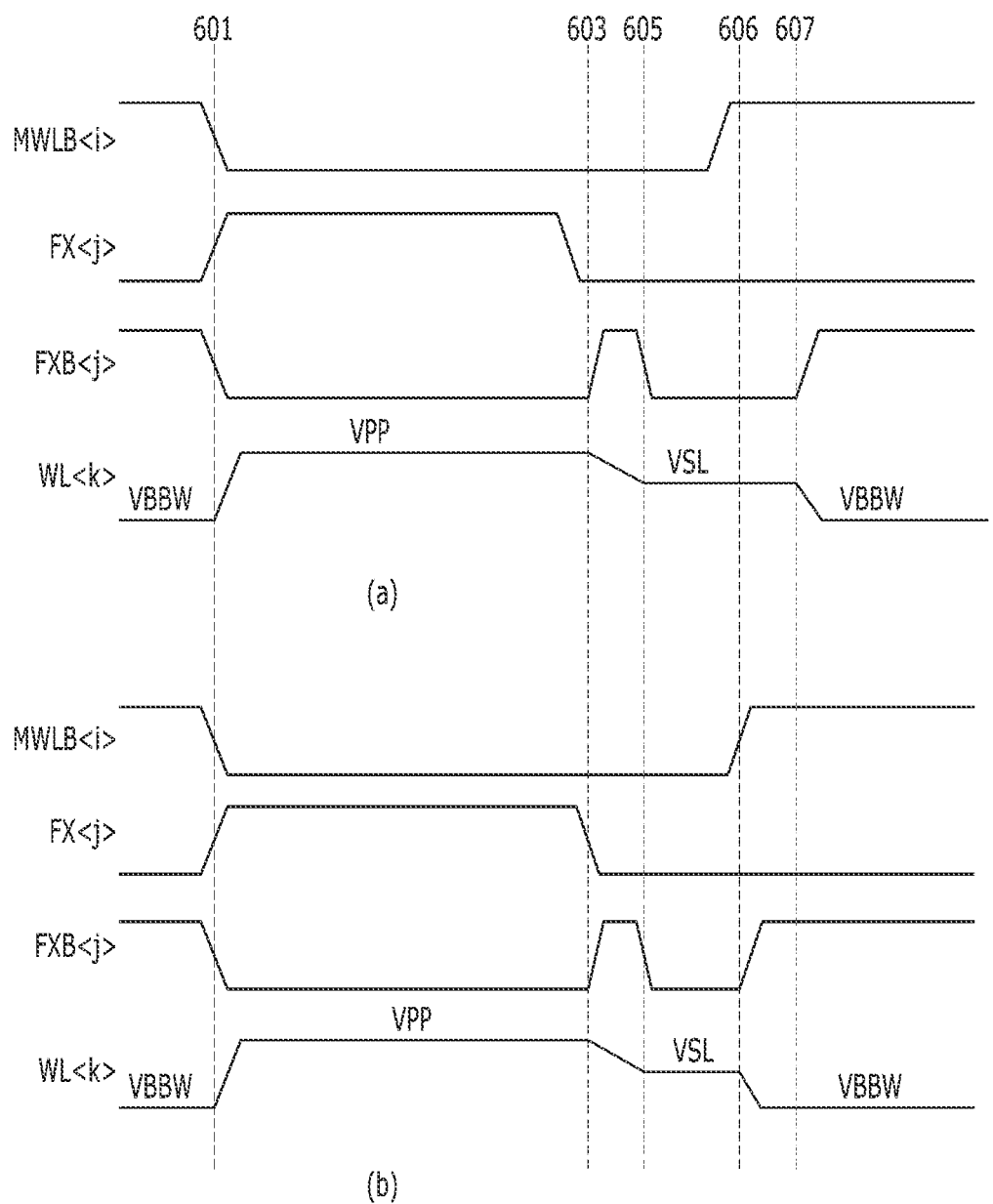
FIG. 6 is a timing diagram for describing an operation of the word line driver in accordance with a second embodiment of the present invention.

FIG. 6 is a timing diagram for describing an operation of the word line driver 320_k in accordance with a second embodiment of the present invention.

In FIG. 6, (a) is a timing diagram for describing an operation of the word line driver 320_k when the word line driver 320_k activates and precharges the word line WL<k> in response to the active command and the precharge command. That is, (a) of FIG. 6 shows the operation of the word line driver 320_k when the refresh flag REF_FLAG is deactivated.

Referring to (a) of FIG. 6, an active operation may begin at a moment 601. At the moment 601, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 603, and the first FIAX signal FX<j> may transition from a high level to a low level. At the moment 603, the second FIAX signal FXB<j> may transition from a low level to a high level and may be maintained until a moment 605. The NMOS transistor 405 of the word line driver 320_k may be turned on from the moment 603 to the moment 605 to pull-down drive the word line WL<k>, and the word line WL<k> may be discharged to the intermediate voltage level VSL. Herein, the intermediate voltage level VSL may be a level which is lower than the active voltage level VPP and higher than the precharge voltage level VBBW. At the moment 605, since the second FIAX signal FXB<j> transitions from a high level to a low level, the NMOS transistor 405 may be turned off, and the voltage level of the word line WL<k> may be maintained at the intermediate voltage level VSL until a moment 607. At the moment 607, since the main word line signal MWLB<1> transitions to a high level and the second FIAX signal FXB<j> transitions to a high level, the NMOS transistors 403 and 405 may be turned on and the word line WL<k> may be discharged to the precharge voltage level VBBW.

In FIG. 6, (b) is a timing diagram for describing an operation of the word line driver 320_k when the word line driver 320_k activates and precharges the word line WL<k> during a refresh operation. That is, (b) of FIG. 6 shows the operation of the word line driver 320_k when the refresh flag REF_FLAG is activated.

Referring to (b) of FIG. 6, an active operation may begin at a moment 601. At the moment 601, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 603, and the first FIAX signal FX<j> may transition from a high level to a low level. At the moment 603, the second FIAX signal FXB<j> may transition from a low level to a high level and may be maintained until a moment 605. The NMOS transistor 405 of the word line driver 320_k may be turned on from the moment 603 to the moment 605 to pull-down drive the word line WL<k>, and the word line WL<k> may be discharged to the intermediate voltage level VSL. At the moment 605, since the second FIAX signal FXB<j> transitions from a high level to a low level, the NMOS transistor 405 may be turned off, and the voltage level of the word line WL<k> may be maintained at the intermediate voltage level VSL until a moment 606. At the moment 606, since the main word line signal MWLB<i> transitions to a high level and the second FIAX signal FXB<j> transitions to a high level, the NMOS transistors 403 and 405 may be turned on and the word line WL<k> may be discharged to the precharge voltage level VBBW.

Referring to (a) of FIG. 6, it may be seen that during a precharge operation which is performed in response to the precharge command, the word line WL<k> may be discharged from the active voltage level VPP to the intermediate voltage level VSL, maintained at the intermediate voltage level VSL for a predetermined time, and then discharged to the precharge voltage level VBBW. Also, it may be seen that during the precharge operation which is performed during the refresh operation of (b) of FIG. 6, the word line WL<k> may be discharged from the active voltage VPP to the intermediate voltage level VSL, maintained at the intermediate voltage level VSL for a predetermined time, and then discharged to the precharge voltage level VBBW.

However, it may be seen from (a) of FIG. 6 that the word line WL<k> may maintain the intermediate voltage level VSL from the moment 605 to the moment 607, but it may be seen from (b) of FIG. 6 that the word line WL<k> may maintain the intermediate voltage level VSL from the moment 605 to the moment 606 (that is, for a shorter time than that of (a) of FIG. 6). In the case of (a) of FIG. 6, the soft-landing operation may be performed more actively than that of (b) of FIG. 6, and it may be seen that the waveforms of the process of precharging the word line WL<k> in the two cases are different from each other.

Figure 7:
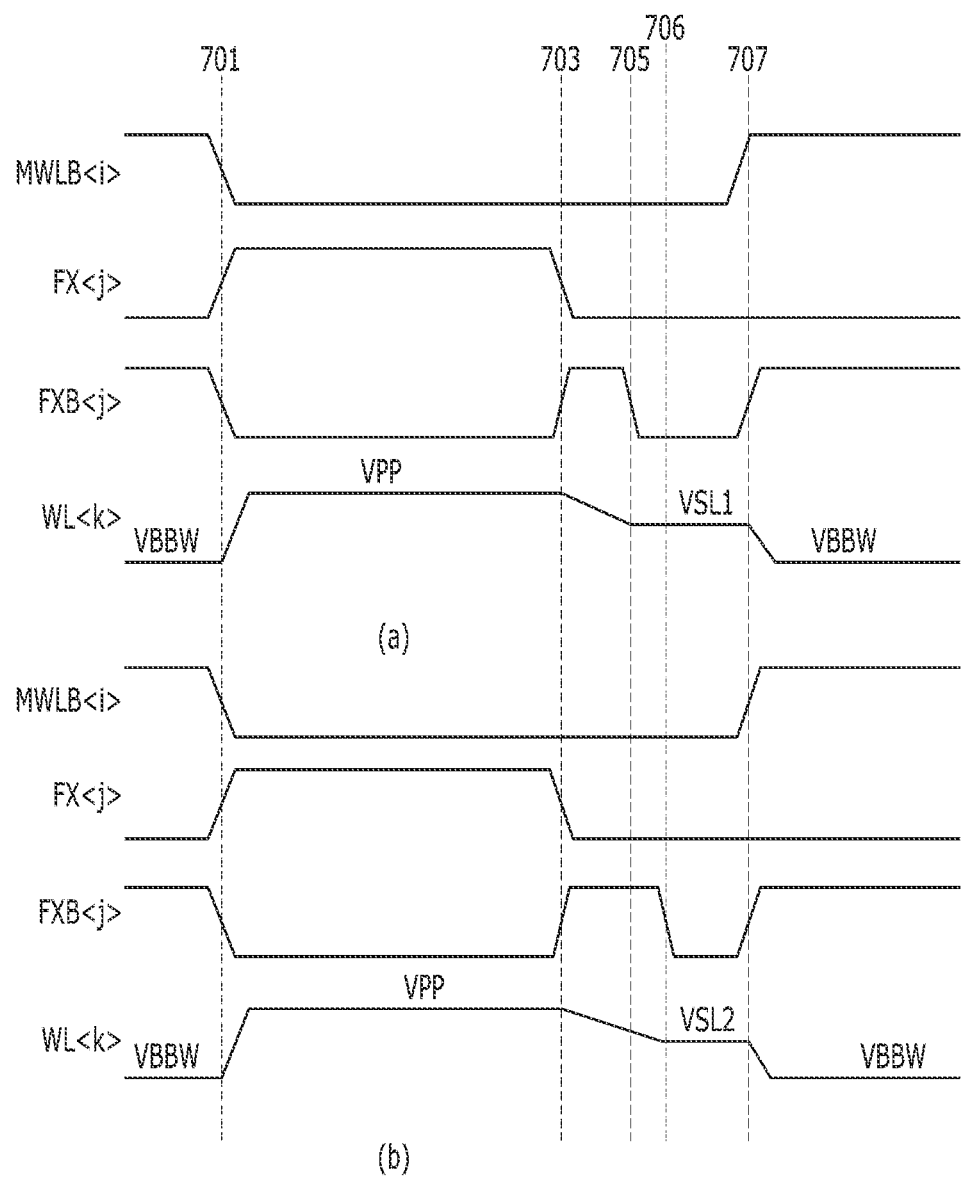
FIG. 7 is a timing diagram for describing an operation of the word line driver in accordance with a third embodiment of the present invention.

FIG. 7 is a timing diagram for describing an operation of the word line driver 320_k in accordance with a third embodiment of the present invention.

In FIG. 7, (a) is a timing diagram for describing an operation of the word line driver 320_k when the word line driver 320_k activates and precharges the word line WL<k> in response to the active command and the precharge command. That is, (a) of FIG. 7 shows the operation of the word line driver 320_k when the refresh flag REF_FLAG is deactivated.

Referring to (a) of FIG. 7, an active operation may begin at a moment 701. At the moment 701, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 703, and the first FIAX signal FX<j> may transition from a high level to a low level. Also, the second FIAX signal FXB<j> may transition from a low level to a high level at the moment 703 and may be maintained until a moment 705. The NMOS transistor 405 of the word line driver 320_k may be turned on from the moment 703 to the moment 705 to pull-down drive the word line WL<k>, and the word line WL<k> may be discharged to a first intermediate voltage level VSL1. Herein, the first intermediate voltage level VSL1 may be a voltage level which is lower than the level of the active voltage VPP and higher than the precharge voltage level VBBW. At the moment 705, since the second FIAX signal FXB<j> transitions from a high level to a low level, the NMOS transistor 405 may be turned off, and the voltage level of the word line WL<k> may be maintained at the first intermediate voltage level VSL1 until a moment 707. At the moment 707, since the main word line signal MWLB<i> transitions to a high level and the second FIAX signal FXB<j> transitions to a high level, the NMOS transistors 403 and 405 may be turned on and the word line WL<k> may be discharged to the precharge voltage level VBBW.

In FIG. 7, (b) is a timing diagram for describing an operation of the word line driver 320_k when the word line driver 320_k activates and precharges the word line WL<k> during a refresh operation. That is, (b) of FIG. 7 shows the operation of the word line driver 320_k when the refresh flag REF_FLAG is activated.

Referring to (b) of FIG. 7, an active operation may begin at a moment 701. At the moment 701, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 703, and the first FIAX signal FX<j> may transition from a high level to a low level. Also, the second FIAX signal FXB<j> may transition from a low level to a high level at the moment 703 and may be maintained until a moment 706. The NMOS transistor 405 of the word line driver 320_k may be turned on from the moment 703 to the moment 706 to pull-down drive the word line WL<k>, and the word line WL<k> may be discharged to a second intermediate voltage level VSL2. Herein, the second intermediate voltage level VSL2 may be a voltage level which is lower than the first intermediate voltage level VSL1 and higher than the precharge voltage level VBBW. In (b) of FIG. 7, since the period that the NMOS transistor 405 is turned on is longer than the period in (a) of FIG. 7, the word line WL<k> may be discharged more than the word line WL<k> in (a) of FIG. 7 to reach the second intermediate voltage level VSL2. At the moment 706, since the second FIAX signal FXB<j> transitions from a high level to a low level, the NMOS transistor 405 may be turned off, and the voltage level of the word line WL<k> may be maintained at the second intermediate voltage level VSL2 until a moment 707. At the moment 707, since the main word line signal MWLB<i> transitions to a high level and the second FIAX signal FXB<j> transitions to a high level, the NMOS transistors 403 and 405 may be turned on and the word line WL<k> may be discharged to the precharge voltage level VBBW.

In both (a) and (b) of FIG. 7, it may be seen that during the precharge operation of the word line WL<k>, the word line WL<k> may not be discharged at once but may be discharged after being maintained at the intermediate voltage level VSL1 and VSL2. However, it may be seen from (a) of FIG. 7 that the word line WL<k> may be discharged after being maintained at the first intermediate voltage level VSL1, which is a relatively higher voltage, but it may be seen from (b) of FIG. 7 that the word line WL<k> may be discharged after being maintained at the second intermediate voltage level VSL2, which is lower than the first intermediate voltage level VSL1. In the case of (a) of FIG. 7, a soft-landing operation may be performed more actively than that of (b) of FIG. 7, and the waveforms of the process of precharging the word line WL<k> in the two cases may be different from each other FIG. 8 is a timing diagram for describing an operation of the word line driver 320_k in accordance with a fourth embodiment of the present invention.

Figure 8:
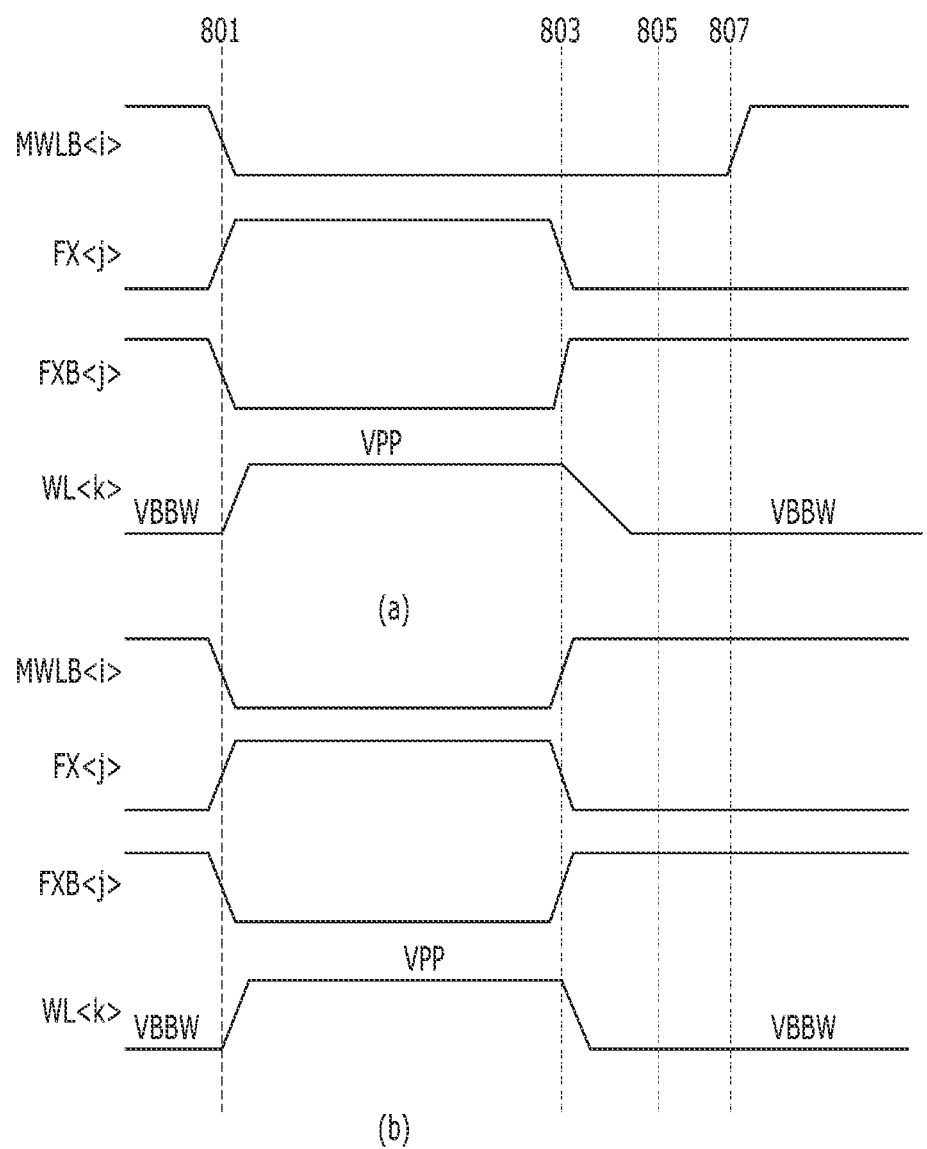
FIG. 8 is a timing diagram for describing an operation of the word line driver in accordance with a fourth embodiment of the present invention.

In FIG. 8, (a) is a timing diagram for describing an operation of the word line driver 320_k when the word line driver 320_k activates and precharges the word line WL<k> in response to the active command and the precharge command. That is, (a) of FIG. 8 shows the operation of the word line driver 320_k when the refresh flag REF_FLAG is deactivated.

Referring to (a) of FIG. 8, an active operation may begin at a moment 801. At the moment 801, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 803, and the first FIAX signal FX<j> may transition from a high level to a low level. Also, at the moment 803, the second FIAX signal FXB<j> may transition from a low level to a high level. The NMOS transistor 405 of the word line driver 320_k may be turned on to pull-down drive the word line WL<k>, and the word line WL<k> may be discharged to the precharge voltage level VBBW. Since only the NMOS transistor 405 is used to discharge the word line WL<k>, the word line WL<k> may reach the precharge voltage level at a moment 805. At a moment 807, the main word line signal MWLB<i> may transition to a high level.

In FIG. 8, (b) is a timing diagram for describing an operation of the word line driver 320_k when the word line driver 320_k activates and precharges the word line WL<k> during a refresh operation. That is, (b) of FIG. 8 shows the operation of the word line driver 320_k when the refresh flag REF_FLAG is activated.

Referring to (b) of FIG. 8, an active operation may begin at a moment 801. At the moment 801, the main word line signal MWLB<i> may transition from a high level to a low level, and the first FIAX signal FX<j> may transition from a low level to a high level, and the second FIAX signal FXB<j> may transition from a high level to a low level. Accordingly, the PMOS transistor 401 of the word line driver 320_k may be turned on, and the PMOS transistor 401 which is turned on may activate the word line WL<k> to the active voltage level VPP.

A precharge operation may begin at a moment 803. At the moment 803, the main word line signal MWLB<i> may transition to a high level, and the first FIAX signal FX<j> may transition to a low level, and the second The FIAX signal FXB<j> may transition to a high level. Accordingly, the NMOS transistors 403 and 405 of the word line driver 320_k may be turned on to pull-down drive the word line WL<k>. Since the word line WL<k> is pulled-down driven by the two NMOS transistors 403 and 405, the word line WL<k> may quickly reach the precharge voltage level VBBW.

In (a) of FIG. 8, it may be seen that the word line WL<k> may be precharged relatively slowly, but in (b) of FIG. 8, it may be seen that the word line WL<k> may be precharged relatively quickly. In the case of (a) of FIG. 8, the word line WL<k> may be precharged more softly than in the case of (b) of FIG. 8, and it may be seen that the waveforms of the process of precharging the word line WL<k> in the two cases may be different from each other.

According to the above-described embodiments of the present disclosure, it may be seen that during a precharge operation which is performed in response to the precharge command, a word line may be precharged more softly, and during the precharge operation which is performed during a refresh operation, a word line may be precharged more hardly. When the effect of row hammering needs to be considered, the effect of row hammering may be reduced by softly precharging the word line, and when it is not necessary to consider the effect of row hammering, the burden of power consumption and time caused by softly precharging the word line unnecessarily may be reduced.

According to the embodiment of the present invention, the burden of a precharge operation that is performed during a refresh operation may be reduced.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory comprising:
   a plurality of word lines; and
   a row circuit configured to
   activate at least one word line among the word lines to an active voltage level during an active operation and discharge the activated word line during a precharge operation,
   wherein the row circuit generates a voltage waveform for discharging the activated word line to a precharge voltage level during a precharge operation that is performed in response to a precharge command, to be different from a voltage waveform for discharging the activated word line to the precharge voltage level during a precharge operation that is performed during a refresh operation.

2. The memory of claim 1, wherein:
   during the precharge operation in response to the precharge command, the activated word line is discharged from the active voltage level to an intermediate voltage level between the active voltage level and the precharge voltage level, maintains the intermediate voltage level for a predetermined time, and then is discharged from the intermediate voltage level to the precharge voltage level, and
   during the precharge operation performed during the refresh operation, the activated word line is discharged from the active voltage level directly to the precharge voltage level.

3. The memory of claim 1, wherein:
   during the precharge operation in response to the precharge command, the activated word line is discharged from the active voltage level to an intermediate voltage level between the active voltage level and the precharge voltage level, maintains the intermediate voltage level for a first time, and then is discharged from the intermediate voltage level to the precharge voltage level, and
   during the precharge operation performed during the refresh operation, the activated word line is discharged from the active voltage level to the intermediate voltage level, maintains the intermediate voltage level for a second time which is shorter than the first time, and then is discharged from the intermediate voltage level to the precharge voltage level.

4. The memory of claim 1, wherein:
   during the precharge operation in response to the precharge command, the activated word line is discharged from the active voltage level to a first intermediate voltage level between the active voltage level and the precharge voltage level, maintains the first intermediate voltage level for a predetermined time, and then is discharged from the first intermediate voltage level to the precharge voltage level, and during the precharge operation performed during the refresh operation, the activated word line is discharged from the active voltage level to a second intermediate voltage level between the first intermediate voltage level and the precharge voltage level, maintains the second intermediate voltage level for a predetermined time, and then is discharged from the second intermediate voltage level to the precharge voltage level.

5. The memory of claim 1, wherein:

during the precharge operation in response to the precharge command, the activated word line is slowly discharged from the active voltage level to the precharge voltage level, and during the precharge operation performed during the refresh operation, the activated word line is quickly discharged from the active voltage level to the precharge voltage level.

6. The memory of claim 1, wherein the refresh operation includes at least one operation among an auto-refresh operation, a self-refresh operation, and a smart refresh operation for mitigating row hammering.

7. The memory of claim 1, wherein the row circuit includes:

a decoder circuit configured to:

decode an address, generate a plurality of control signals for controlling voltage levels of the word lines, and control activation and deactivation timings of a portion of the control signals in a different manner between when a refresh flag signal is activated and when the refresh flag signal is deactivated; and a plurality of word line drivers configured to drive the word lines in response to the control signals.

8. A memory, comprising:

a plurality of word lines; and a row circuit configured to:

activate a selected word line among the word lines in response to activation of a row active signal, and precharge the selected word line in response to deactivation of the row active signal, wherein the row circuit generates a voltage waveform for precharging the selected word line according to activation of a refresh flag signal representing whether a refresh operation is being performed, to be different from a voltage waveform for precharging the selected word line according to deactivation of the refresh flag signal.

9. The memory of claim 8, wherein, when the refresh flag signal is deactivated, the row circuit precharges the selected word line by:

discharging the selected word line from an active voltage level to an intermediate voltage level between the active voltage level and a precharge voltage level, maintaining the intermediate voltage level for a predetermined time, and discharging the selected word line from the intermediate voltage level to the precharge voltage level, and wherein, when the refresh flag signal is activated, the row circuit precharges the selected word line by discharging the selected word line from the active voltage level directly to the precharge voltage level.

10. The memory of claim 8, wherein, when the refresh flag signal is deactivated, the row circuit precharges the selected word line by:

discharging the selected word line from an active voltage level to an intermediate voltage level between the active voltage level and a precharge voltage level, maintaining the intermediate voltage level for a first time, and discharging the selected word line from the intermediate voltage level to the precharge voltage level, and wherein, when the refresh flag signal is activated, the row circuit precharges the selected word line by:

discharging the selected word line from the active voltage level to the intermediate voltage level, maintaining the intermediate voltage level for a second time which is shorter than the first time, and discharging the selected word line from the intermediate voltage level to the precharge voltage level.

11. The memory of claim 8, wherein, when the refresh flag signal is deactivated, the row circuit precharges the selected word line by:

discharging the selected word line from an active voltage level to a first intermediate voltage level between the active voltage level and a precharge voltage level, maintaining the first intermediate voltage level for a predetermined time, and discharging the selected word line from the first intermediate voltage level to the precharge voltage level, and wherein, when the refresh flag signal is activated, the row circuit precharges the selected word line by:

discharging the selected word line from the active voltage level to a second intermediate voltage level between the first intermediate voltage level and the precharge voltage level, maintaining the second intermediate voltage level for a predetermined time, and discharging the selected word line from the second intermediate voltage level to the precharge voltage level.

12. The memory of claim 8, wherein, when the refresh flag signal is deactivated, the row circuit precharges the selected word line by slowly discharging the selected word line from an active voltage level to a precharge voltage level, and wherein, when the refresh flag signal is activated, the row circuit precharges the selected word line by quickly discharging the selected word line from the active voltage level to the precharge voltage level.

13. An operating method of a memory, the operating method comprising:

discharging with a first voltage waveform, in response to a precharge command, a word line from an active level to a precharge level; and discharging with a second voltage waveform, during a refresh operation, the word line from the active level to the precharge level, wherein the second voltage waveform is different from the first voltage waveform.

14. The operating method of claim 13, wherein:

the word line is discharged, in response to the precharge command, stepwise from the active level to the precharge level via an intermediate level, and the word line is discharged, during the refresh operation, from the active level directly to the precharge level.

15. The operating method of claim 13, wherein:

the word line is discharged, in response to the precharge command, stepwise from the active level to the precharge level via an intermediate level, a voltage level of the word line staying the intermediate level for a longer time, and the word line is discharged, during the refresh operation, stepwise from the active level to the precharge level via the intermediate level, the voltage level staying the intermediate level for a shorter time.

16. The operating method of claim 13, wherein:

the word line is discharged, in response to the precharge command, stepwise from the active level to the precharge level via a first intermediate level, a voltage level of the word line staying the first intermediate level for a longer time, the word line is discharged, during the refresh operation, stepwise from the active level to the precharge level via a second intermediate level, the voltage level staying the second intermediate level for a shorter time, and the first intermediate level is higher than the second intermediate level.

17. The operating method of claim 13, wherein:

the word line is discharged, in response to the precharge command, directly from the active level to the precharge level, a voltage level of the word line transitioning for a longer time, and the word line is discharged, during the refresh operation, directly from the active level to the precharge level, the voltage level transitioning for a shorter time.

\* \* \* \* \*